(12) United States Patent
Willham et al.

(10) Patent No.: US 9,076,731 B2
(45) Date of Patent: Jul. 7, 2015

(54) ARCHITECTURAL PANELS WITH ORGANIC PHOTOVOLTAIC INTERLAYERS AND METHODS OF FORMING THE SAME

(75) Inventors: John E. C. Willham, Sandy, UT (US); M. Hoyt Brewster, Salt Lake City, UT (US)

(73) Assignee: 3Form, LLC, Salt Lake City, UT (US)

( * ) Notice: Subject to any disclaimer, the term of this patent is extended or adjusted under 35 U.S.C. 154(b) by 89 days.

(21) Appl. No.: 13/615,146

(22) Filed: Sep. 13, 2012

(65) Prior Publication Data
US 2013/0061913 A1 Mar. 14, 2013

Related U.S. Application Data

(62) Division of application No. 13/263,978, filed as application No. PCT/US2010/030602 on Apr. 9, 2010, now Pat. No. 8,418,418.

(60) Provisional application No. 61/173,879, filed on Apr. 29, 2009.

(51) Int. Cl.
*H01L 31/048* (2014.01)
*H01L 27/30* (2006.01)
*H01L 31/042* (2014.01)

(52) U.S. Cl.
CPC ............. *H01L 27/301* (2013.01); *Y02E 10/549* (2013.01); *B32B 2457/12* (2013.01); *H01L 31/048* (2013.01); *H01L 31/042* (2013.01)

(58) Field of Classification Search
CPC ............ Y02E 10/549; B32B 2307/414; B32B 2457/12; B32B 17/0807; B32B 17/0816; B32B 17/0825; B32B 17/0871; B29C 66/70; H01L 31/048; H01L 31/0488; H01L 31/049
USPC ................. 156/99–107, 214, 309.6; 264/259, 264/271.1
See application file for complete search history.

(56) References Cited

U.S. PATENT DOCUMENTS

| | | | |
|---|---|---|---|
| 3,565,719 A | | 2/1971 | Webb |
| 3,957,537 A | * | 5/1976 | Baskett et al. ................. 136/251 |

(Continued)

FOREIGN PATENT DOCUMENTS

| | | |
|---|---|---|
| EP | 0874404 A2 | 10/1992 |
| EP | 0554877 | 8/1993 |

(Continued)

OTHER PUBLICATIONS

KIPO, Search Report and Written Opinion of PCT/US2010/030602, date of mailing Nov. 26, 2010, 8 pages.
(Continued)

*Primary Examiner* — Scott W Dodds
(74) *Attorney, Agent, or Firm* — Workman Nydegger

(57) ABSTRACT

A method of making a photovoltaic panel includes previously preparing one or more pre-formed substrates with a first temperature and pressure to be non-planar, textured, embossed, colored, or combinations thereof. A manufacturer can then prepare a laminate assembly comprising one or more organic photovoltaic components one or more pre-formed substrates, and a barrier layer with one or more thermally-activated thermoplastic tie layers there between. The manufacturer can then finish the photovoltaic panel lamination by subjecting the assembly to a second set of temperatures and pressures sufficient to activate and bond the pre-formed substrate, barrier layer, and photovoltaic components without significantly softening the pre-formed substrates or otherwise degrading/damaging the organic photovoltaic components. A non-planar panel made by this method can be used in both exterior and interior decorative and/or structural applications where electrical generation is desired.

34 Claims, 7 Drawing Sheets

(56) References Cited

U.S. PATENT DOCUMENTS

| | | | |
|---|---|---|---|
| 4,713,492 A | 12/1987 | Hanak | |
| 4,717,790 A | 1/1988 | Gochermann | |
| 4,816,324 A | 3/1989 | Berman | |
| 4,860,509 A | 8/1989 | Laaly et al. | |
| 4,913,744 A | 4/1990 | Hoegl et al. | |
| 5,022,930 A | 6/1991 | Ackerman et al. | |
| 5,059,254 A | 10/1991 | Yaba et al. | |
| 5,092,939 A | 3/1992 | Nath | |
| 5,107,637 A | 4/1992 | Robbins | |
| 5,176,758 A * | 1/1993 | Nath et al. | 136/251 |
| 5,252,139 A | 10/1993 | Schmitt et al. | |
| 5,507,880 A | 4/1996 | Ishikawa et al. | |
| 5,508,205 A * | 4/1996 | Dominguez et al. | 438/67 |
| 5,589,008 A | 12/1996 | Keppner | |
| 5,968,287 A | 10/1999 | Nath | |
| 5,998,729 A | 12/1999 | Shiomi et al. | |
| 6,063,995 A | 5/2000 | Bohland et al. | |
| 6,063,996 A | 5/2000 | Takada et al. | |
| 6,129,779 A | 10/2000 | Bohland et al. | |
| 6,160,215 A | 12/2000 | Curtin | |
| 6,177,711 B1 | 1/2001 | Kariya | |
| 6,187,150 B1 | 2/2001 | Yoshimi et al. | |
| 6,215,060 B1 | 4/2001 | Komori et al. | |
| 6,222,115 B1 | 4/2001 | Nakanishi | |
| 6,242,685 B1 | 6/2001 | Mizukami et al. | |
| 6,252,157 B1 | 6/2001 | Nishio | |
| 6,268,559 B1 | 7/2001 | Yamawaki | |
| 6,271,053 B1 | 8/2001 | Kondo | |
| 6,271,149 B1 | 8/2001 | Kondo et al. | |
| 6,288,324 B1 | 9/2001 | Komori et al. | |
| 6,288,326 B1 | 9/2001 | Hayashi et al. | |
| 6,300,593 B1 | 10/2001 | Powell | |
| 6,310,281 B1 | 10/2001 | Wendt et al. | |
| 6,348,159 B1 | 2/2002 | Dapkus et al. | |
| 6,357,649 B1 | 3/2002 | Okatsu et al. | |
| 6,360,497 B1 | 3/2002 | Nakazima et al. | |
| 6,362,414 B1 | 3/2002 | Fujisawa et al. | |
| 6,365,531 B1 | 4/2002 | Hayashi et al. | |
| 6,365,823 B1 | 4/2002 | Kondo | |
| 6,365,825 B1 | 4/2002 | Hayashi et al. | |
| 6,369,315 B1 | 4/2002 | Mizukami et al. | |
| 6,372,538 B1 | 4/2002 | Wendt et al. | |
| 6,380,025 B1 | 4/2002 | Suzuki et al. | |
| 6,380,480 B1 | 4/2002 | Norimatsu et al. | |
| 6,384,318 B1 | 5/2002 | Nomura | |
| 6,388,301 B1 | 5/2002 | Tawada et al. | |
| 6,391,165 B1 | 5/2002 | Bohland et al. | |
| 6,395,971 B1 | 5/2002 | Bendel et al. | |
| 6,416,814 B1 | 7/2002 | Giolando | |
| 6,444,898 B1 | 9/2002 | Fujisawa et al. | |
| 6,453,629 B1 | 9/2002 | Nakazima et al. | |
| 6,455,347 B1 | 9/2002 | Hiraishi et al. | |
| 6,469,242 B1 | 10/2002 | Kondo | |
| 6,489,552 B2 | 12/2002 | Yamawaki et al. | |
| 6,498,380 B1 | 12/2002 | Otani et al. | |
| 6,500,690 B1 | 12/2002 | Yamagishi et al. | |
| 6,504,139 B1 | 1/2003 | Hirata et al. | |
| 6,506,260 B1 | 1/2003 | Hiraishi et al. | |
| 6,506,970 B2 | 1/2003 | Yamawaki | |
| 6,541,693 B2 | 4/2003 | Takada et al. | |
| 6,548,751 B2 | 4/2003 | Sverdrup, Jr. et al. | |
| 6,551,715 B1 | 4/2003 | Seto et al. | |
| 6,559,411 B2 | 5/2003 | Borgeson et al. | |
| 6,602,606 B1 | 8/2003 | Fujisawa et al. | |
| 6,607,936 B2 | 8/2003 | Nomura | |
| 6,617,010 B2 | 9/2003 | Yoshimi et al. | |
| 6,617,507 B2 | 9/2003 | Mapes et al. | |
| 6,627,765 B2 | 9/2003 | Giolando | |
| 6,632,993 B2 | 10/2003 | Hayashi et al. | |
| 6,690,041 B2 | 2/2004 | Armstrong et al. | |
| 6,693,809 B2 | 2/2004 | Engler | |
| 6,719,848 B2 | 4/2004 | Faykosh et al. | |
| 6,784,360 B2 | 8/2004 | Nakajima et al. | |
| 6,849,560 B2 | 2/2005 | Suezaki et al. | |
| 6,852,920 B2 | 2/2005 | Sager et al. | |
| 6,919,530 B2 | 7/2005 | Borgeson et al. | |
| 6,933,714 B2 | 8/2005 | Fasshauer et al. | |
| 6,936,761 B2 | 8/2005 | Pichler | |
| 6,946,597 B2 | 9/2005 | Sager et al. | |
| 6,959,517 B2 | 11/2005 | Poddany et al. | |
| 6,967,115 B1 | 11/2005 | Sheats | |
| 6,987,071 B1 | 1/2006 | Bollman et al. | |
| 7,000,664 B2 | 2/2006 | Kondoh | |
| 7,045,205 B1 | 5/2006 | Sager | |
| 7,098,395 B2 | 8/2006 | Hiraishi et al. | |
| 7,115,304 B2 | 10/2006 | Roscheisen et al. | |
| 7,122,398 B1 | 10/2006 | Pichler | |
| 7,194,197 B1 | 3/2007 | Wendt et al. | |
| 7,227,066 B1 | 6/2007 | Roscheisen et al. | |
| 7,247,346 B1 | 7/2007 | Sager et al. | |
| 7,262,392 B1 | 8/2007 | Miller | |
| 7,271,333 B2 | 9/2007 | Fabick et al. | |
| 7,276,724 B2 | 10/2007 | Sheats et al. | |
| 7,291,782 B2 | 11/2007 | Sager et al. | |
| 7,297,867 B2 | 11/2007 | Nomura et al. | |
| 7,306,823 B2 | 12/2007 | Sager et al. | |
| 7,307,209 B2 | 12/2007 | Mapes et al. | |
| 7,342,171 B2 | 3/2008 | Khouri et al. | |
| 7,374,963 B2 | 5/2008 | Basol | |
| 7,449,629 B2 | 11/2008 | Ferri et al. | |
| 7,462,774 B2 | 12/2008 | Roscheisen et al. | |
| 7,504,159 B1 * | 3/2009 | Suare et al. | 428/532 |
| 7,507,321 B2 | 3/2009 | Aksu et al. | |
| 7,509,775 B2 | 3/2009 | Flaherty et al. | |
| 7,511,217 B1 | 3/2009 | Roscheisen et al. | |
| 7,535,019 B1 | 5/2009 | Sager et al. | |
| 7,541,067 B2 | 6/2009 | Basol | |
| 7,582,506 B2 | 9/2009 | Basol | |
| 7,585,547 B2 | 9/2009 | Basol | |
| 2001/0014542 A1 | 8/2001 | Kondo et al. | |
| 2002/0043277 A1 | 4/2002 | Yamawaki | |
| 2002/0153037 A1 | 10/2002 | Fischer | |
| 2003/0172873 A1 | 9/2003 | Fischer et al. | |
| 2003/0175411 A1 * | 9/2003 | Kodas et al. | 427/58 |
| 2004/0031518 A1 | 2/2004 | Plantfeber | |
| 2004/0112425 A1 | 6/2004 | Torres et al. | |
| 2004/0139999 A1 | 7/2004 | Romo | |
| 2005/0016972 A1 | 1/2005 | Borgeson et al. | |
| 2005/0029613 A1 | 2/2005 | Fujisawa et al. | |
| 2005/0095422 A1 | 5/2005 | Sager et al. | |
| 2005/0098202 A1 | 5/2005 | Maltby, Jr. | |
| 2005/0133781 A1 | 6/2005 | Yan et al. | |
| 2005/0150542 A1 | 7/2005 | Madan | |
| 2005/0183767 A1 | 8/2005 | Yu et al. | |
| 2005/0183768 A1 | 8/2005 | Roscheisen et al. | |
| 2005/0186342 A1 | 8/2005 | Sager et al. | |
| 2005/0257824 A1 | 11/2005 | Maltby, Jr. | |
| 2006/0028166 A1 | 2/2006 | Closset et al. | |
| 2006/0046026 A1 | 3/2006 | Fujisawa et al. | |
| 2006/0060237 A1 | 3/2006 | Leidholm et al. | |
| 2006/0121701 A1 | 6/2006 | Basol | |
| 2006/0153985 A1 | 7/2006 | Roscheisen et al. | |
| 2006/0169989 A1 | 8/2006 | Bhattacharya et al. | |
| 2006/0174934 A1 | 8/2006 | Sager et al. | |
| 2006/0174935 A1 | 8/2006 | Sawada et al. | |
| 2006/0207644 A1 | 9/2006 | Robinson et al. | |
| 2006/0225776 A1 | 10/2006 | Nemazi et al. | |
| 2006/0261733 A1 | 11/2006 | Suzuki et al. | |
| 2006/0261817 A1 | 11/2006 | Poddany | |
| 2007/0012353 A1 | 1/2007 | Fischer et al. | |
| 2007/0065962 A1 | 3/2007 | Pichler | |
| 2007/0068571 A1 | 3/2007 | Li et al. | |
| 2007/0074755 A1 | 4/2007 | Eberspacher et al. | |
| 2007/0092648 A1 | 4/2007 | Duren et al. | |
| 2007/0093006 A1 | 4/2007 | Basol | |
| 2007/0093059 A1 | 4/2007 | Basol | |
| 2007/0145507 A1 | 6/2007 | Basol | |
| 2007/0163638 A1 | 7/2007 | Van Duren et al. | |
| 2007/0163641 A1 | 7/2007 | Duren et al. | |
| 2007/0166964 A1 | 7/2007 | Basol | |
| 2007/0169809 A1 | 7/2007 | Van Duren et al. | |
| 2007/0169813 A1 | 7/2007 | Robinson et al. | |
| 2007/0186971 A1 | 8/2007 | Lochun et al. | |
| 2007/0221269 A1 | 9/2007 | Sakai et al. | |

(56) References Cited

U.S. PATENT DOCUMENTS

| | | |
|---|---|---|
| 2007/0227633 A1 | 10/2007 | Basol |
| 2007/0232065 A1 | 10/2007 | Basol |
| 2007/0243657 A1 | 10/2007 | Basol et al. |
| 2007/0272558 A1 | 11/2007 | Aksu et al. |
| 2007/0289626 A1 | 12/2007 | Brabec et al. |
| 2007/0295386 A1 | 12/2007 | Capps et al. |
| 2007/0295388 A1 | 12/2007 | Adriani et al. |
| 2007/0295389 A1 | 12/2007 | Capps et al. |
| 2008/0000518 A1 | 1/2008 | Basol |
| 2008/0023059 A1 | 1/2008 | Basol |
| 2008/0041434 A1 | 2/2008 | Adriani et al. |
| 2008/0053522 A1 | 3/2008 | Basol |
| 2008/0087320 A1 | 4/2008 | Mapes et al. |
| 2008/0093221 A1 | 4/2008 | Basol |
| 2008/0095938 A1 | 4/2008 | Basol |
| 2008/0096307 A1 | 4/2008 | Basol |
| 2008/0098672 A1 | 5/2008 | O'Hagin et al. |
| 2008/0099062 A1 | 5/2008 | Armstrong et al. |
| 2008/0099063 A1 | 5/2008 | Armstrong et al. |
| 2008/0110498 A1 | 5/2008 | Zafar et al. |
| 2008/0128020 A1 | 6/2008 | Zafar et al. |
| 2008/0128022 A1 | 6/2008 | Roberts et al. |
| 2008/0149176 A1 | 6/2008 | Sager et al. |
| 2008/0155908 A1 | 7/2008 | Nomura et al. |
| 2008/0169025 A1 | 7/2008 | Basol et al. |
| 2008/0173390 A1 | 7/2008 | Narasimhan et al. |
| 2008/0175993 A1 | 7/2008 | Ashjaee et al. |
| 2008/0196659 A1 | 8/2008 | Basol |
| 2008/0196756 A1 | 8/2008 | Basol |
| 2008/0202584 A1 | 8/2008 | Basol |
| 2008/0210295 A1 | 9/2008 | Basol |
| 2008/0302030 A1 | 12/2008 | Stancel et al. |
| 2008/0302031 A1 | 12/2008 | Bressler et al. |
| 2008/0314439 A1 | 12/2008 | Misra |
| 2009/0000221 A1 | 1/2009 | Jacobs et al. |
| 2009/0000222 A1 | 1/2009 | Kalkanoglu et al. |
| 2009/0020149 A1 | 1/2009 | Woods et al. |
| 2009/0031641 A1 | 2/2009 | Grazioso |
| 2009/0035882 A1 | 2/2009 | Basol |
| 2009/0050208 A1 | 2/2009 | Basol et al. |
| 2009/0077804 A1 * | 3/2009 | Bachrach et al. ........ 29/890.033 |
| 2009/0078313 A1 | 3/2009 | Basol |
| 2009/0078318 A1 | 3/2009 | Meyers et al. |
| 2009/0087942 A1 | 4/2009 | Meyers |
| 2009/0092744 A1 | 4/2009 | Pinarbasi et al. |
| 2009/0113822 A1 | 5/2009 | Patrina et al. |
| 2009/0117684 A1 | 5/2009 | Basol |
| 2009/0133340 A1 * | 5/2009 | Shiao et al. ................. 52/173.3 |
| 2009/0145472 A1 | 6/2009 | Li |
| 2009/0148598 A1 | 6/2009 | Zolla et al. |
| 2009/0148669 A1 | 6/2009 | Basol |
| 2009/0165853 A1 | 7/2009 | Sawada et al. |
| 2009/0173634 A1 | 7/2009 | Aksu et al. |
| 2009/0183675 A1 | 7/2009 | Pinarbasi et al. |
| 2009/0194165 A1 | 8/2009 | Murphy et al. |
| 2009/0194166 A1 | 8/2009 | Powell et al. |
| 2009/0199895 A1 | 8/2009 | Basol |
| 2009/0203165 A1 | 8/2009 | Pinarbasi et al. |
| 2009/0211637 A1 | 8/2009 | Eaglesham |
| 2009/0255585 A1 * | 10/2009 | Shaikh et al. ................. 136/261 |

FOREIGN PATENT DOCUMENTS

| | | | |
|---|---|---|---|
| EP | 1726046 B1 | 11/2006 | |
| JP | 2004-356349 | * 12/2004 | ............ H01L 31/042 |
| JP | 2008218419 | 9/2008 | |
| WO | 2004077576 A1 | 9/2004 | |
| WO | 2010126699 | 11/2010 | |

OTHER PUBLICATIONS

Office Action mailed Sep. 12, 2012, U.S. Appl. No. 13/263,978, filed Oct. 11, 2011.

International Search Report and Opinion for PCT/US2010/030602 mailed Nov. 26, 2010.

* cited by examiner

ARCHITECTURAL PANELS WITH ORGANIC PHOTOVOLTAIC INTERLAYERS AND METHODS OF FORMING THE SAME

CROSS-REFERENCE TO RELATED APPLICATIONS

The present application is a Divisional of U.S. patent application Ser. No. 13/263,978, filed on Oct. 11, 2011, which is a 371 U.S. National Stage of PCT Application No. PCT/US2010/30602, filed Apr. 9, 2010 entitled "ARCHITECTURAL PANELS WITH ORGANIC PHOTOVOLTAIC INTERLAYERS AND METHODS OF FORMING THE SAME," which claims the benefit of priority to U.S. Provisional Application No. 61/173,879, filed Apr. 29, 2009, entitled "Laminating Organic Photovoltaic Components with Pre-formed Substrates." The entire contents of each of the foregoing applications are incorporated by reference herein.

BACKGROUND OF THE INVENTION

1. Technical Field

The present disclosure relates generally to systems, methods, and apparatus for preparing architectural panels including organic photovoltaic interlayers.

2. Background and Relevant Art

Photovoltaic (PV) modules comprise materials that generate electrical power in response to photon exposure, such as via photons from sunlight or other light sources. Conventional photovoltaic components for use in electrical generation typically comprise inorganic elements such as crystalline silicone (c-Si). Conventional inorganic photovoltaic (IPV) modules tend to have several drawbacks. For example, conventional IPV modules are typically resistant to high service or processing temperatures, but are brittle in nature and are opaque. These and other aspects of IPV modules tend to impose limitations on the use of IPV modules, including mounting configurations.

For example, the brittleness of IPVs can prevent an IPV construct from having certain shapes or structure, which can limit or hinder the aesthetics of a given structure supporting the IPV construct. This hindrance can be especially pronounced when the structure supporting the IPV construct is non-planar, angled, or curved. As a result, conventional mechanisms for creating PV panels typically include preparing solar panels in a small form, such as in the form of roof tiles, or otherwise embedding IPV cells within the construction materials themselves. Again, however, because the IPV components are typically both planar and rigid, the construction materials themselves also need to be both planar and rigid, which continues to limit the use and application of such construction materials.

Recent advances in IPV module technology, such as thin film IPV cells that are deposited as films onto a given substrate, can be produced into more flexible PV modules when embedded into flexible substrates. Examples of thin film IPV modules include photovoltaic cells made from amorphous silicone (a-Si), cadmium telluride (CdTe), copper indium gallium selenide (CIGS), and alloys thereof. Like the early generation c-Si photovoltaic module constructs, these newer photovoltaic technologies comprise inorganic elements. Unfortunately, these newer types of IPV modules are still opaque, and thus can result in undesirable shading, darkness, or lack of visibility in spaces beneath or behind the photovoltaic.

A recent generation of thin-film photovoltaic modules includes organic semiconductor materials comprising one or more forms of organic molecule nanostructures (often axially-oriented). Organic semiconductor PV materials have the benefit of tending to be less expensive than those PV constructs of inorganic components. While the preparation of organic photovoltaic (OPV) cells allows the photovoltaic cells themselves to be relatively translucent, unfortunately, OPV cells also tend to be sensitive and unstable, particularly in the presence of water and oxygen. To properly isolate OPV nodes from the elements (snow, wind, dust, etc.), manufacturers of OPV cells tend to encapsulate the cells within a flexible, thin, silicon-coated, film of oriented polyester (such as polyethylene terephthalate, or PET, and/or polybutylene terephthalate, or, PBT and the like). Manufacturers also sometimes employ halogenated fluoropolymer films such as ethylene tetrafluoroethylene (ETFE) and polyvinylidene fluoride (PVDF) due to their resistivity to UV degradation, clarity and barrier properties.

These types of encapsulating films tend to be relatively useful for most consumer applications, but, unfortunately, oxygen barrier additives/coatings and low surface energy halogenated polymers make lamination of these films difficult by conventional and scalable methods. Furthermore, OPV elements are sensitive to temperature and pressures that limit the use and restricts process-ability required to assemble these types of OPV modules for use as durable and structural exterior applications. For example, non-stabilized silicon-coated oriented PET (such as MYLAR from DUPONT) film tends to degrade when directly exposed to sunlight (e.g., in outdoor applications) for an extended period of time. (This may be since changes in the films properties and aesthetics may begin to change with more than a week of consecutive UV exposure.) Hence, degradation of the encapsulating film properties, in turn, results, ultimately, in degradation and loss of efficiency of the OPV cells.

One solution to improve the barrier and structural characteristics of the OPV cells would be to attach, such as by lamination, or encapsulate these module inside an improved barrier assembly. Unfortunately, it is not a simple matter to laminate the silicone-coated-, oriented-polyester- or fluoropolymer-film-encapsulated photovoltaics. For example, a manufacturer may desire to minimize degradation of the MYLAR film (or similarly-composed film) from UV radiation from direct sunlight by laminating the MYLAR-encapsulated components between opposing glass or resin substrates. Such lamination between opposing resin or glass substrates can improve the oxygen and water vapor barrier properties of the structure, thereby increasing the service life of the OPV cells.

For example, one method of attachment of the MYLAR/OPV system can involve the use of adhesives that cure at (or substantially near) ambient temperature via air curing, or via photo-curable cross-linking mechanisms. While room-temperature-curable adhesives tend to achieve good adhesion results to the silicon-coated oriented-polyester film, such constructs can result in significant air entrapment or contamination/debris between the oriented-polyester film/OPV module and the substrate. Such conditions increase the risk of field failure of the laminate structure.

Of course, other lamination methods that require high temperatures and pressures sufficient to fuse the substrates and OPV cells together are highly likely to ruin the underlying OPV cells, which are sensitive to high temperatures. Specifically, lamination methods that include temperatures and pressures sufficient to get the encapsulation films to a particular liquid state for fusion lamination require temperatures above that which OPV cells are able to withstand.

BRIEF SUMMARY OF THE INVENTION

Implementations of the present invention solve one or more of the foregoing problems in the art with systems, methods, and apparatus configured to stably and adequately laminate flexible, OPV cells, modules, or components to or between pre-formed substrates, such as non-planar or textured substrates. In particular, implementations of the present invention allow a manufacturer to fuse flexible, OPV cells, including those constructed with an oriented polyester film, to or between pre-formed substrates with elevated temperatures and pressures. Such processes and apparatus, even with elevated temperature and pressure, can be implemented without degrading the OPV component performance.

For example, one implementation of a method of manufacturing an architectural panel with organic photovoltaic interlayers can involve forming a starting material with a first temperature and a first pressure sufficient to allow for softening and forming thereof. The method can then involve cooling the starting material below the glass transition temperature of the starting material to create a pre-formed substrate. After cooling of the pre-formed substrate, the method can involve preparing a laminate assembly comprising the pre-formed substrate, one or more organic photovoltaic components or modules, and an at least partially translucent barrier layer. Additionally, the method can involve subjecting the laminate assembly to a second temperature and a second pressure configured to fuse the laminate assembly together. The second temperature and the second pressure can be sufficiently low to prevent degrading of the one or more organic photovoltaic components or modules.

Also, an implementation of an organic photovoltaic panel can comprise a pre-formed substrate comprising an upper surface and a lower surface and one or more organic photovoltaic components fused to the upper surface of the pre-formed substrate. The panel can further comprise an at least partially translucent barrier layer fused to one or more of the upper surface of the pre-formed substrate and the one or more organic photovoltaic components. The organic photovoltaic components can be preserved from degradation by the pre-formed substrate and barrier layer. Additionally, the organic photovoltaic laminate panel can have a lamination strength of at least about 2 ft.-lbs of force.

Furthermore, a structure configured to be exposed to the elements and adapted to produce energy upon exposure to a light source (artificial or natural) can include an architectural panel with organic photovoltaic interlayers. The structure can include a frame and one or more translucent, photovoltaic, power-generating architectural panels mounted to the frame. The one or more architectural panels can include one or more translucent, organic photovoltaic components comprising an organic photovoltaic modules or cell adhered within an encapsulation film. Additionally, the one or more architectural panels can include a pre-formed translucent substrate fused to the encapsulation film of the one or more organic photovoltaic components. The one or more architectural panels can further include a barrier layer fused to one or more of the pre-formed substrate and the encapsulation film of the one or more organic photovoltaic components.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. It should be noted that the figures are not drawn to scale, and that elements of similar structure or function are generally represented by like reference numerals for illustrative purposes throughout the figures. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention extends to systems, methods, and apparatus configured to stably and adequately laminate flexible, OPV cells, modules, or components to or between pre-formed substrates, such as non-planar or textured substrates. In particular, implementations of the present invention allow a manufacturer to fuse flexible, OPV cells, including those constructed with an oriented polyester film, to or between pre-formed substrates with elevated temperatures and pressures. Such processes and apparatus, even with elevated temperature and pressure, can be implemented without degrading the OPV component performance.

Implementations of the present invention also include durable, architectural panels with OPV interlayers. The durability and strength of such panels can allow a manufacturer to implement the panels as outdoor building components, such as roofs, walls, canopies, facades, and other structures. In addition to having structure properties sufficient for use as building components, architectural panels with OPV interlayers of one or more implementations of the present invention also provide improved oxygen and water vapor barrier than the module alone, thereby increasing the service life of the OPV cells.

Figure 1:
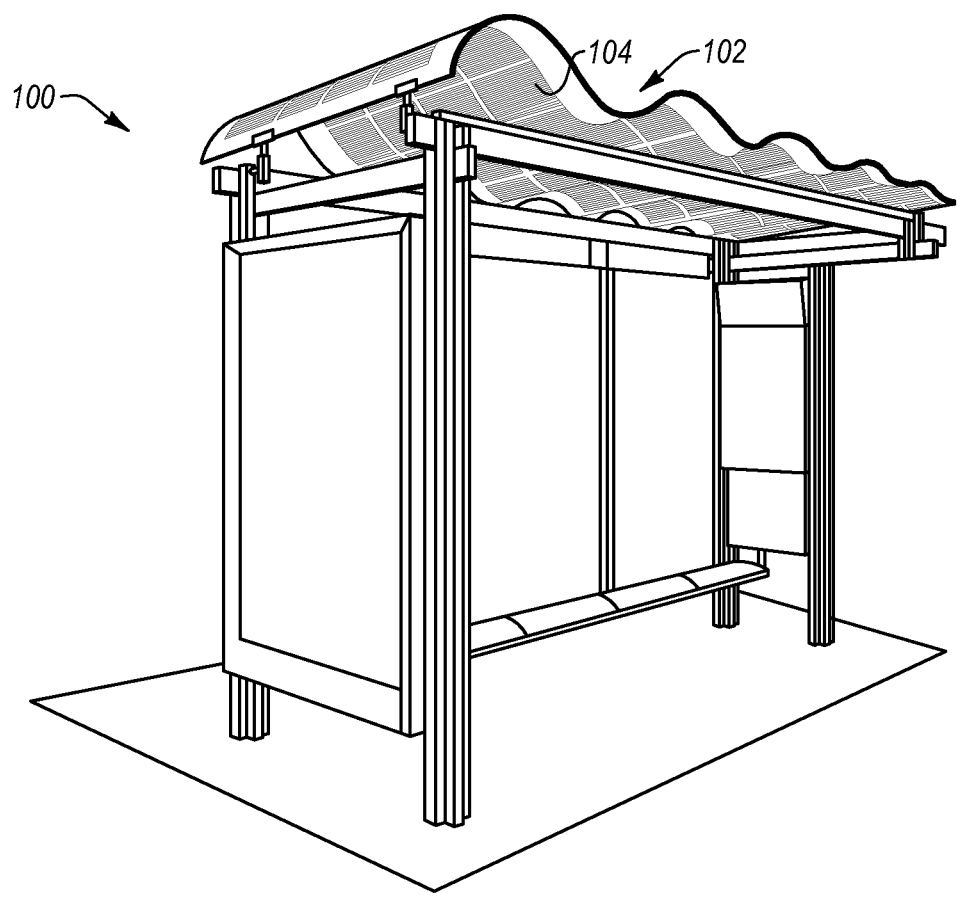
FIG. 1 illustrates a schematic diagram of a durable, architectural panel with organic photovoltaic interlayers implemented as a roof for a bus shelter in accordance with an implementation of the present invention.

For example, FIG. 1 illustrates a schematic diagram of a structure 100 (in this case a bus shelter) having a roof made of an architectural panel with OPV interlayers 102, i.e., wherein panel 102 is a panel laminate comprising a substrate 130(a, b) including OPV components or interlayers (104). The panel with OPV interlayers 102 can have a size and configuration to provide it with sufficient properties, such as durability, impact strength, ability to support weight, rigidity, etc. to allow a manufacturer to incorporate it into a structure as a building material. One will appreciate in light of the disclosure herein that such panels with OPV interlayers 102 can provide significant advantages over retrofitted photovoltaic structures. For example, in addition to the ability to provide a principal or ancillary source of electrical power, the panel with OPV interlayers 102 can blend in with the rest of the structure and have a greater aesthetic appeal than conventional retrofitted solar options. Furthermore, a manufacturer can offset some, or all, of the initial cost of the panel with OPV interlayers 102 by reducing the cost of the materials, processing, and labor associated with the structure that the panel with OPV interlayers 102 replaces.

In addition to improved structural properties, the methods of one or more implementations of the present invention can provide a panel with OPV interlayers 102 with various non-planar or curved configurations. For example, FIG. 1 illustrates a panel with OPV interlayers 102 having an undulating configuration. Methods of the present invention can allow manufacturer to shape or configure architectural panels with OPV interlayers 102 into almost limitless shapes and configurations, while also preserving the integrity of the embedded OPVs. Thus, one will appreciate that the panel with OPV interlayers 102 can add to the aesthetic characteristics of a given structure or design space, in addition to providing non-emitting energy generation.

As previously mentioned, implementations of the present invention relate to panels having OPV components or interlayers 104 and to methods of producing the same. As used herein, the terms "organic photovoltaic component," "OPV component," "organic photovoltaic interlayer," "organic photovoltaic module," and "organic photovoltaic cell" mean a component or other structure including an OPV material that is photo-reactive such that when exposed to light it interacts therewith to generate power. This is in contrast to structure or components having conventional IPV materials. In at least one implementation, the OPV material can comprise an ink or a photo-reactive polymer, which a manufacturer can print or otherwise coat onto a film.

Figure 2:
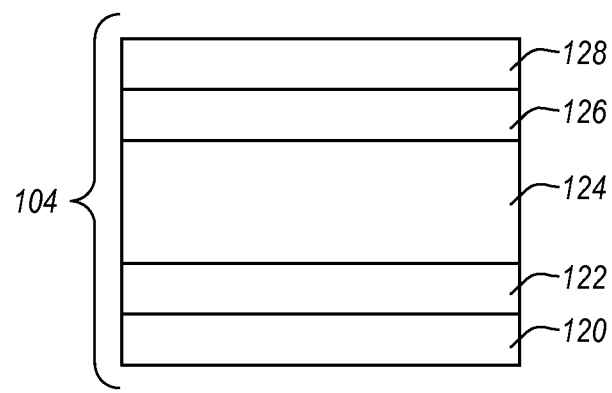
FIG. 2 illustrates a side view of an organic photovoltaic component in accordance with an implementation of the present invention.

For example, FIG. 2 illustrates a cross-sectional view of one implementation of an OPV component 104. The OPV component 104 can comprise a bottom film or encapsulation layer 120, a first electrode 122, an OPV material 124, a second electrode 126, and an upper encapsulation layer 128. In some implementations, each layer of the OPV component 104 can be at least partially translucent, or alternatively fully transparent. In further implementations, the layers (i.e., 120, 122) below the OPV material 124 may be opaque.

Additionally, the OPV component 104 can be flexible, allowing a manufacturer to conform the OPV component 104 over a pre-formed substrate, as explained in greater detail below. For instance, the OPV component 104 can have a relatively small thickness or gauge, thereby providing OPV component 104 with flexibility. In particular, in some implementations the total thickness of the OPV component 104 can be between about 0.25 mm and about 1.0 mm. More specifically, the OPV component 104 can have a thickness of about 0.50 mm. In alternative implementations, the OPV component 104 can have a thickness greater than about 1.0 mm or less than about 0.25 mm.

The bottom encapsulation layer 120 can comprise a clear thermoplastic film, such as MYLAR, or the like, or other types of films with similar physical properties (e.g., similar to uni- or biaxially-oriented polyethylene terephthalate polyester film) or of fluoropolymer films such as ETFE or PVDF. More specifically, the encapsulation layer 120 can comprise materials such as polymeric hydrocarbons, polyethylene terephthalates, polyethylene naphthalates, polyimides, cellulosic polymers, polycarbonates, polyamides, polyethers, and polyether ketones. In some implementations, the encapsulation layer 120 can include combinations of polymeric materials or different regions of different materials. In yet further implementations, the encapsulation layer 120 can comprise metal, glass, or other suitable materials.

The upper encapsulation layer 128 can be identical to the bottom encapsulation layer 120. Alternatively, the upper encapsulation layer 128 can differ from the bottom encapsulation layer 120. For example, the upper encapsulation layer can comprise a transparent material, while the bottom encapsulation layer 120 comprises a translucent or opaque material. In any event, the upper encapsulation layer 128 can comprise one or more polymers, such as those described above in relation to the bottom encapsulation layer 120. In yet additional implementations, the OPV component 104 may not include an upper encapsulation layer 128.

The first electrode 122 and the second electrode 126 can each comprise a generally electrically conductive material. For example, in some implementations one or more of the first electrode 122 and the second electrode 126 can comprise a plurality of electrically conductive particles dispersed within a polymer. Additionally, the first electrode 122 and the second electrode 126 can comprise a cathode and an anode, respectively. Alternatively, the second electrode 126 can comprise a cathode and the first electrode 122 can comprise an anode.

Referring now to the OPV material 124, in at least one implementation of the present invention, the OPV material 124 can comprise an electron donor material and an electron acceptor material. Thus, light can interact with the OPV material 124 causing electrons to transfer from the electron donor material to the electron acceptor material. Each of the electron donor material and the electron acceptor material comprise organic materials. For example, in some implementations the electron acceptor material can comprise fullerenes, substituted fullerenes, polymers containing moieties capable of accepting electrons, other organic materials capable of accepting electrons, or combinations thereof. Similarly, the electron donor material can comprise conjugated polymers, polythiophenes, polycyclopentadithiophenes, copolymers thereof, other organic materials capable of donating electrons, or combinations thereof. In any event, the OPV material 124 comprises one or more organic materials that when exposed to light interacts therewith to generate power.

As previously mentioned, the present invention includes methods of forming architectural panels including OPVs, which provide a barrier for the OPV components against oxygen and water vapor without degrading the OPV components 104. In particular, implementations of the present invention include methods of forming a panel with OPV interlayers 102 using a pre-formed substrate. As used herein, the term "pre-formed substrate" means a substrate that has undergone one or more processing steps to change one or more physical characteristics of the substrate. More specifically, the one or more processing steps include subjecting the substrate to a temperature above its glass transition temperature. For example, a pre-formed substrate of the present invention can include a resin or glass panel that a manufacturer has processed to provide it with one or more of a non-planar configuration, texture, or embossing.

Figure 3A:
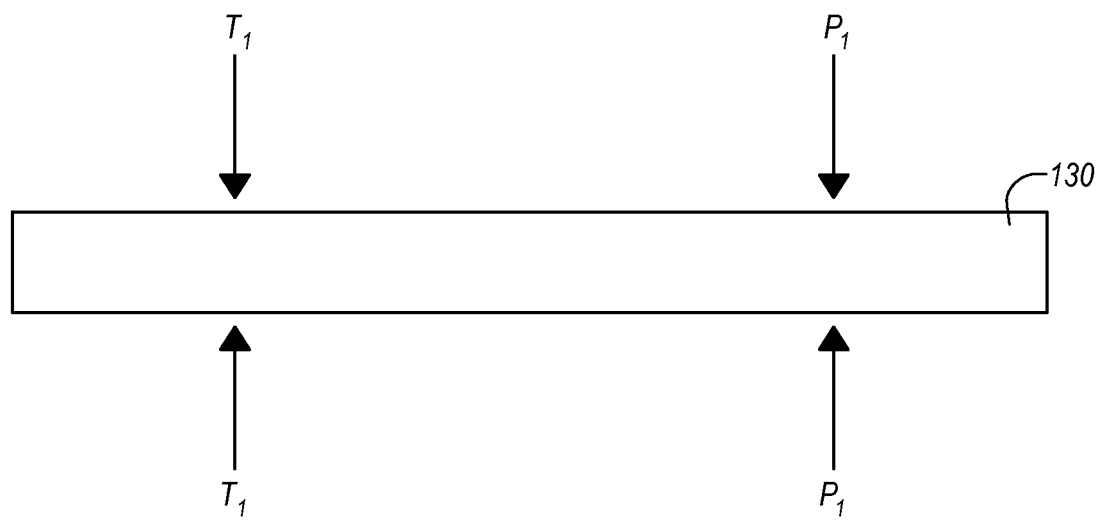
FIG. 3A illustrates a side view of a substrate that a manufacturer can form into a pre-formed substrate in accordance with an implementation of the present invention.

For example, FIG. 3A illustrates a side view of a substrate to which a manufacturer can apply a first temperature and pressure to form a pre-formed substrate (in this case a non-planar substrate) for use in accordance with the present invention. In particular, the manufacturer can use a starting material. For example, in one implementation, the starting material comprises a glass sheet. In additional implementations, however, the starting materials can comprise polymeric resin pellets before the molding process. In still further implementations, as shown by FIG. 3A, the starting material comprises a resin-based sheet or substrate 130, such as a substantially planar substrate as shown.

As used herein, the terms "resin-based sheet," "resin-based substrate," and "resin substrate" mean a substrate comprising materials of one or more layers or sheets formed from any one of the following thermoplastic polymers (or alloys thereof). Specifically, such materials include but are not limited to, polyethylene terephthalate (PET), polyethylene terephthalate with glycol-modification (PETG), acrylonitrile butadiene-styrene (ABS), polyvinyl chloride (PVC), polycarbonate (PC), styrene, polymethyl methacrylate (PMMA), polyolefins (low and high density polyethylene, polypropylene), cellulose-based polymers (cellulose acetate, cellulose butyrate or cellulose propionate), or the like. Such materials can also include other thermoplastic polymers or thermoplastic polymer blends, which a manufacturer can heat above their glass transition temperature and impart with shape, texture, or color, and then subsequently cooled to solid form. In addition, any given resin substrate or sheet can include one or more resin-based substrates and any number other layers or coatings.

One will appreciate that the substrate 130 can have any appropriate thickness for the resulting thickness of the final panel with OPV interlayers 102. Thus, in some implementations the substrate 130 can have a thickness sufficient to provide a resulting panel with OPV interlayers 102 with adequate strength and durability for use as a building component. The thickness of the substrate 130 can thus be dependent upon the material properties of the starting materials 130. In any event, in some implementations, the substrate 130 can comprise a substrate having a thickness of between about one-thirty-second of an inch (1/32") and about five inches (5"). More specifically, the substrate 130 can have a thickness of about one-half an inch (1/2"), about one quarter an inch (1/4"), about one-eighth an inch (1/8"), about one-sixteenth an inch (1/16"), or about one inch (1"), as desired.

The size (i.e., surface area) of the substrate 130 can also be any appropriate size for the resulting size of the final panel with OPV interlayers 102. For example, the substrate 130 can be about four feet by about eight feet (4'×8'), about four feet by about ten feet (4'×10'), about six feet by about fifteen feet (6'×15'), or taller/wider. Or alternatively, the substrate 130 can be about six inches by about six inches (6"×6") or shorter/skinnier. Thus, a manufacturer can tailor both the gauge and size of the substrate 130 depending upon the desired dimensions of a resulting panel with OPV interlayers 102.

No matter the size of the substrate 130, FIG. 3A shows that a manufacturer can subject the starting materials (i.e., substrate 130) to a first temperature $T_1$ and a first pressure $P_1$ sufficient to allow for softening and forming of the substrate 130. Thus, the term "first temperature $T_1$" means a temperature that is at or above $T_g$ of the starting materials (i.e., substrate 130). By contrast, as used herein, the term "first pressure $P_1$" means a pressure sufficient to provide the needed contact force to form the particular type of pre-formed substrate.

In one implementation, the first temperature $T_1$ and pressure $P_1$ comprises a range of temperature from about 200° F. to about 500° F., and a pressure of about 0.03 atm (or about 0.4 to about 0.5 psi) to about 13 atm (or about 190 to about 200 psi), depending on the particular sheet material. For example, copolyesters and acrylics can generally be formed at temperatures of about 250° F. to about 350° and pressures of about 0.5 to about 200 psi. By contrast, a manufacturer can form materials such as polycarbonate at higher temperatures and similar pressures, such as temperatures of about 330° F. to about 420° F., and pressures of about of about 0.5 psi to about 200 psi. One will, of course, appreciate, that these temperatures and pressures can also be dependent upon the type of heating/forming apparatus. For example, a manufacturer can generally form the starting materials (i.e., substrate 130) via slumping or with pressure (via mechanical or vacuum or pneumatic) assisted forming in conjunction with heating devices (ovens, radiant heaters, temperature chambers).

Figure 3B:
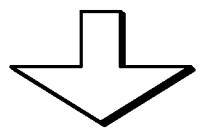
FIG. 3B illustrates a side view of a pre-formed, non-planar substrate formed from the substrate of FIG. 3A.
Figure 3B:
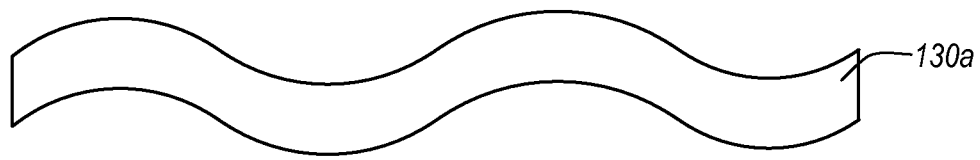

In any event, once the substrate 130 is softened, the manufacturer can form the substrate by shaping the heated substrate 130 into a non-planar configuration, embedding a texture into one or more surfaces of the heated substrate. For example, FIG. 3B illustrates a pre-formed substrate 130a, which a manufacturer has formed by applying a first pressure $P_1$ in connection with a mold (not shown) to the heated substrate 130.

Alternatively, with respect to polymeric resin starting materials, for example, the manufacturer may use conventional injection molding techniques to melt resin pellets and inject the resin into a die shaped as pre-formed substrate 130a. Similarly, with glass starting materials, a manufacturer can melt the glass precursors and place the melted form of the same in a glass mold to achieve a non-planar, pre-formed substrate 130a.

Figure 4A:
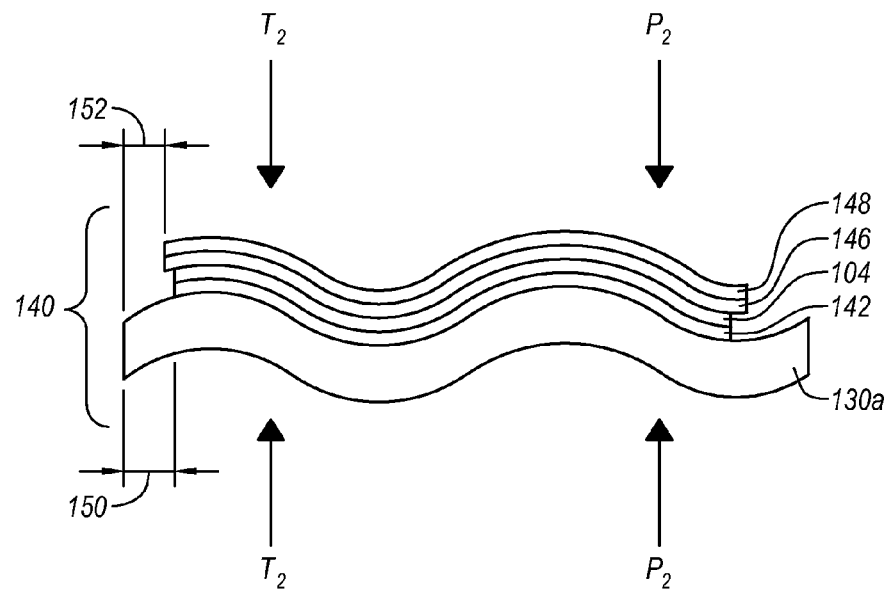
FIG. 4A illustrates a side view of a laminate assembly that a manufacturer may use in forming a durable, architectural panel with organic photovoltaic interlayers in accordance with an implementation of the present invention.

FIG. 4A shows that, once the manufacturer has created one or more pre-formed substrates 130a (a non-planar substrate in this particular implementation), the manufacturer can then begin the process of creating a laminate assembly (pursuant to creating the final laminate). In particular, FIG. 4A illustrates a sequential overview for positioning components of the laminate sheet assembly 140 prior to subjecting the components to a lamination process. In general, FIG. 4A shows that the layup sandwich/laminate sheet assembly 140 can comprise a pre-formed substrate 130a.

FIG. 4A further shows that laminate sheet assembly 140 can also include one or more thermoplastic tie layers 142, 146. In general, thermoplastic tie layers 142, 146 comprise material specifically chosen to create a combination of mechanical and chemical bonding of immediately adjacent layers when subjected to particular temperatures and pressures. The temperatures particularly applicable to the implementations of this invention are described hereinafter. For example, thermoplastic tie layers 142, 146 can comprise solid film-format ethylene vinyl acetate or "EVA"; ethylene acrylates, such as ethyl methacrylate or "EMA"; polyvinyl butyral or "PVB"; or any thermoplastic polyurethane (TPU) of aliphatic or aromatic construct capable of adhering opposing resin sheets together with applied heat. In any event, FIG. 4A illustrates that a manufacturer can place a first thermoplastic tie layer 142 against, or on top of, the pre-formed substrate 130a.

As mentioned previously, the laminate sheet assembly 140 can also include one or more OPV components or interlayers 104, such as OPV component 104 described hereinabove in relation to FIG. 2. Thus, in at least one implementation, the OPV component 104 comprises a film on which the manufacturer has printed one or more OPV inks. The OPV component 104 can also include one or more protective laminate films, which are substantially flexible, that encapsulate the film and OPV links, such the encapsulation layers or films 120, 128 described herein above. Thus, these encapsulating films can be comprised of clear thermoplastic films, such as MYLAR, or the like.

As illustrated by FIG. 4A, the manufacturer can then place one or more OPV components 104 on top of, or otherwise against, the first thermoplastic tie layer 142. Next the manufacturer can place a second thermoplastic tie layer 146 on top of, or otherwise against, the OPV component 104. One advantage provided by thermoplastic tie layers, such as those aforementioned, is that bonding can be effectuated more easily in some cases between the OPV component 104 and adjacent layers at lower temperatures and pressures than typically used without thermoplastic tie layers. Furthermore, processes required for lamination with a thermoplastic tie layer, such as EVA, can aid in removing air bubbles efficiently compared with using spray-applied or roll-applied liquid-based contact adhesives. Nevertheless, one will appreciate that liquid adhesives may also be appropriate in place of thermoplastic tie layers 142, 146 in some cases.

In any event, the laminate assembly 140 can also include a barrier layer 148 positioned against the second thermoplastic tie layer 146. The barrier layer 148 can comprise an at least partially translucent resin layer, such as a protective film. For example, the barrier layer 148 can comprise a clear acrylic multipolymer, such as KORAD film, an OPTIX acrylic sheet, or other layer adapted to bond to a thermoplastic tie layer 146 and also provide strength and weatherability. As explained in greater detail below, the barrier layer 148 can alternatively comprise a pre-formed substrate. In at least one implementation, the barrier layer 148 can have UV screening properties such that the barrier layer 148 is resistant to degradation due to prolonged UV exposure. In other words, the barrier layer 148 may comprise a material that does not easily degrade with prolonged UV exposure.

One will appreciate that in order to provide the greatest amount of photon exposure to the OPV components 104, the barrier layer 148 can have a relatively small thickness or gauge. For example, in some implementations, the barrier layer 148 may have a thickness of from about 1.8 mils (0.0018") to about one-sixteenth an inch (1/16"). In alternative implementations, the barrier layer 148 may have a thickness greater than about one-sixteenth an inch (1/16"). Thus, as illustrated by FIG. 4A, in at least one implementation the laminate assembly 140, and any resulting panel, can have an asymmetrical configuration. In other words, to maximize strength and durability, while also maximizing the power generation efficiency, the barrier layer 148 may be substantially thinner than the opposing outer layer (i.e., 130a) of the laminate assembly 140.

In addition to having a relatively small thickness, the barrier layer 148 can otherwise allow a maximum amount of photon exposure to pass through to the OPV components 104. For example, the barrier layer 148 may be transparent or otherwise configured to maximize passage of light. In additional implementations, however, the barrier layer 148 may be colored or partially translucent to provide a desired aesthetic.

FIG. 4A further illustrates that in at least one implementation, the manufacturer can position the OPV components 104 a first distance 150 from any edge of the pre-formed substrate 130a. Additionally, the manufacturer can position the barrier layer 148 over the OPV components 104 a second distance 152 from any edge of the pre-formed substrate 130a. As shown by FIG. 4A, the first distance may be greater than the second distance. By positioning the OPV components 104 and barrier layer 148 at first and second distances 150, 152, respectively, from the edges of the pre-formed substrate 130a, the manufacturer can ensure an "off edge" lamination. The off edge lamination of the OPV components 104 can improve the lamination integrity of the resulting panel, and limit water vapor and air from entering between the laminate edges and degrading the OPV components 104.

In any event, upon preparing the laminate assembly 140, FIG. 4A further shows that the manufacturer can subject the laminate assembly 140 to one or more second temperatures $T_2$ and second pressures $P_2$. In general, the manufacture can configure the second temperatures $T_2$ and second pressures $P_2$ to soften and activate the thermoplastic tie layers 142, 146 in order to achieve both mechanical and chemical bonding between layers of the laminate assembly 140.

One will appreciate that the second temperatures $T_2$ and second pressures $P_2$ can also be low enough to ensure that the OPV components 104 are not compromised during the lamination process. Additionally, such temperatures and pressures can similarly be sufficiently low in order to allow the pre-formed substrate 130a to maintain the form provided according to the steps outlined in FIG. 3A. More specifically, the second temperatures $T_2$ and second pressures $P_2$ may be high enough in some cases to cause some minor softening or melting at the immediate surface level (e.g., adjacent the thermoplastic tie layers 142, 146). Nevertheless, second temperatures $T_2$ and second pressures $P_2$ may not be high enough to cause the pre-formed substrate 130 to substantially soften and/or change form.

In at least one implementation, second temperature $T_2$ and second pressure $P_2$ comprises temperatures up to about 250° F. and pressures between about 0.5 atm (or about 7-8 psi) and about 10 atm (or about 145-150 psi). Furthermore, the manufacturer can apply such temperatures and pressures in any number of apparatus, such as in a pressurized oven, lamination press, or autoclave. In an autoclave, a manufacturer may further perform the lamination by inserting the materials of the above-described laminate assembly 140 into a vacuum bag.

Figure 4B:
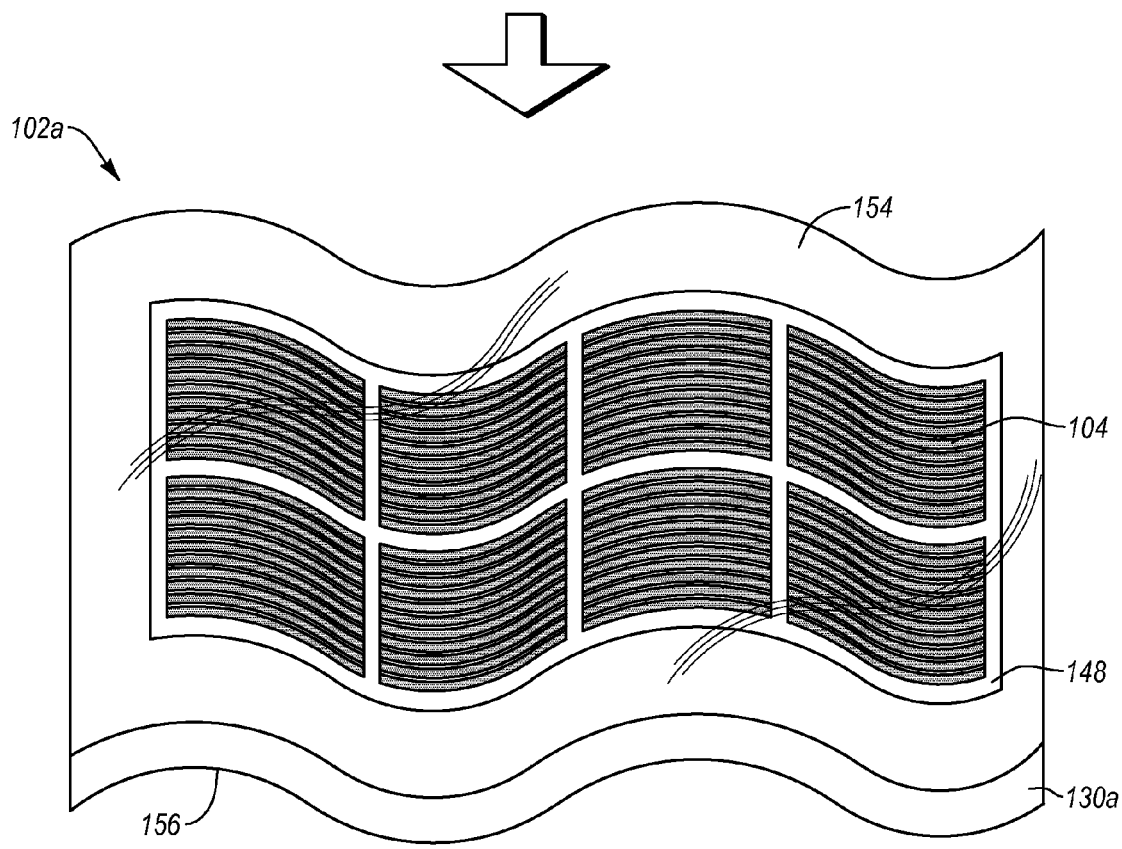
FIG. 4B illustrates a top, perspective view of a durable, architectural panel with organic photovoltaic interlayers formed from the laminate assembly of FIG. 4A.

No matter how applied, the second temperatures $T_2$ and second pressures $P_2$ can cause the layers of the laminate assembly 140 to fuse together and form a laminate panel with OPV interlayers. For example, FIG. 4B illustrates an example of a panel with OPV interlayers 102a produced using the methods described above in relation to FIG. 4A. The panel with OPV interlayers 102a can thus include a pre-formed substrate 130a with an upper surface 154 and a lower surface 156. The panel with OPV interlayers 102a can further include one or more OPV components 104 fused to the upper surface 154 of the pre-formed substrate 130a. Additionally, the panel with OPV interlayers 102a can include an at least partially translucent barrier layer 148 fused (via a thermoplastic tie layer) to one or more of the upper surface 154 of the pre-formed substrate 130a and the one or more OPV components 104.

One will appreciate in light of the disclosure herein that the panel with OPV interlayers 102a can include desirable mechanical and aesthetic properties. For example, the panel with OPV interlayers 102a can preserve the OPV components 104 from degradation. Furthermore, the panel with OPV interlayers 102a can have a lamination strength of at least about 2 fl.-lbs of force. Additionally, the panel with OPV interlayers 102a can have an aesthetically pleasing shape (i.e., non-planar).

In addition to the shape, the panel with OPV interlayers 102a can also be at least partially translucent. For example, as shown in FIG. 4B the panel with OPV interlayers 102a can include spaces between the OPV components 104. These spaces can allow light to pass through the panel with OPV interlayers 102a. Additionally or alternatively, the entire panel with OPV interlayers 102a (i.e., each layer of the panel) can be at least partially translucent or even transparent.

One will appreciate that a manufacturer can use the methods and components of the present invention to create any number of laminate assemblies and resulting panel with OPV interlayers. Thus, the specific laminate assemblies and panels shown and described above are for illustrative purposes and should not be construed to limit the present invention, or any specific implementation thereof. For example, while the laminate assembly 140 and resulting panel with OPV interlayers 102a described above has an asymmetrical configuration, alternative implementations can include a symmetrical configuration.

Figure 5:
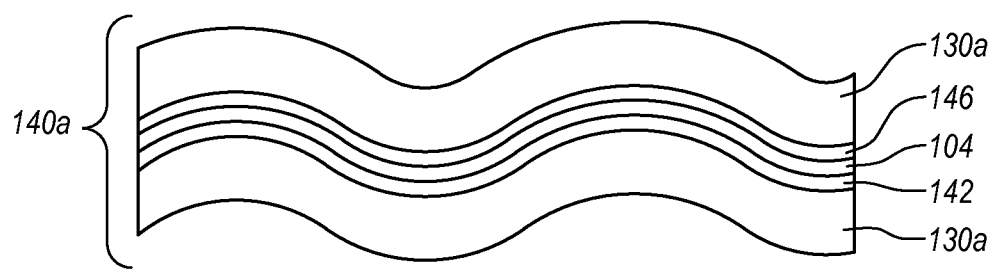
FIG. 5 illustrates a side view of another laminate assembly that a manufacturer may use in forming a durable, architectural panel with organic photovoltaic interlayers in accordance with an implementation of the present invention.

For instance, FIG. 5 illustrates a laminate assembly 140a having a symmetrical configuration. Specifically, the laminate assembly 140a comprises opposing pre-formed substrates 130a, first and second thermoplastic tie layers 142, 146, and one or more OPV comments 104. A manufacturer can form each of the pre-formed substrates 130a using the methods described herein above in relation to FIGS. 3A-3B. Thus, the barrier layer of the laminate assembly 140a can comprise a pre-formed substrate 130a. One will appreciate that using a pre-formed substrate 130a as a barrier layer can provide a resulting laminate panel with yet additional strength and durability.

FIG. 5 further illustrates that in some implementations of the present invention the laminate assembly 140a, and any resulting laminate panel, may not include off-edge lamination of the barrier layer 130a and OPV components 104. In other words, each layer of the laminate assembly 140a may have substantially the same size (length and width). Such implementations can allow for the maximum number of OPV components 104 within a single panel.

Additionally, as previously mentioned, pre-formed substrates of the present invention are not limited to non-planar or curved substrates such as those shown as described in relation to FIGS. 3B, 4A-4B, and 5. For example, pre-formed substrates also include substrates imparted with a color and/or texture. Furthermore, pre-formed substrates of the present invention also include substrates including a combination of one or more of a non-planar configuration, a texture or embossing, or an imparted color.

Figure 6A:
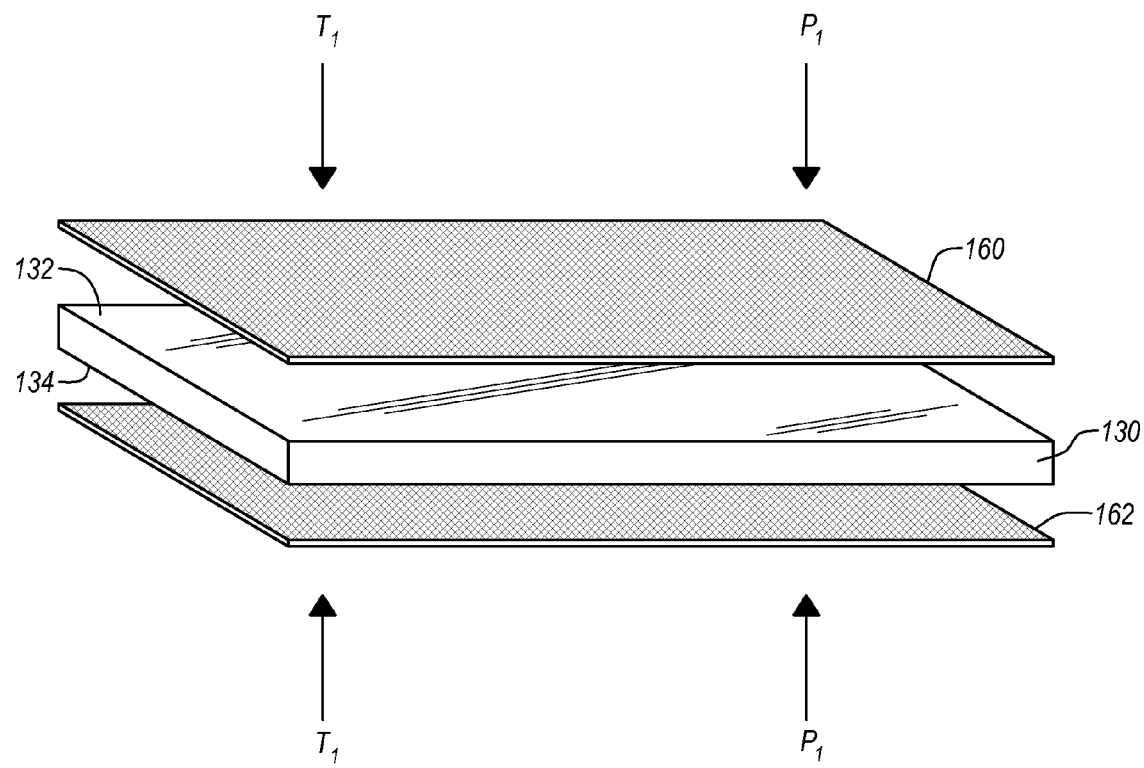
FIG. 6A illustrates a side, perspective view of a substrate and texture layers that a manufacturer use in forming a pre-formed substrate in accordance with an implementation of the present invention.

For example, FIG. 6A illustrates a side view of a substrate to which a manufacturer can apply a first temperature and pressure to form a pre-formed substrate (in this case a textured substrate) for use in accordance with the present invention. In particular, the manufacturer can use a starting material, which FIG. 6A illustrates can be a resin substrate 130. Specifically, FIG. 3A shows that a manufacturer can subject the starting materials (i.e., substrate 130) to a first temperature $T_1$ and a first pressure $P_1$ sufficient to allow for softening and forming of the substrate 130.

In one implementation, the first temperature $T_1$ and pressure $P_1$ comprises a range of temperature from about 200° F. to about 500° F., and a pressure of about 0.03 atm (or about 0.4 to about 0.5 psi) to about 13 atm (or about 190 to about 200 psi), depending on the particular sheet material. The manufacturer can generally apply the first temperature $T_1$ and pressure $P_1$ to the starting materials (i.e., substrate 130) in a vacuum bag, vacuum table and/or similar air evacuation apparatus (such as an autoclave), or a lamination press.

In any event, after the manufacturer has softened the substrate 130 (or while softening the substrate 130), the manufacturer can impart a texture into one or more surfaces thereof. For instance, the manufacturer can provide texture to the heated substrate 130 by pressing a textured layer 160, 162 against one or more surfaces 132, 134 of the substrate 130. The textured layer 160, 162 can impart a corresponding texture in the applicable surface(s) 132, 134 of the substrate 130.

Figure 6B:
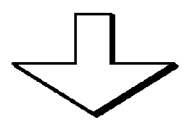
FIG. 6B illustrates a side, perspective view of a pre-formed, textured substrate formed from the substrate of FIG. 6A.
Figure 6B:
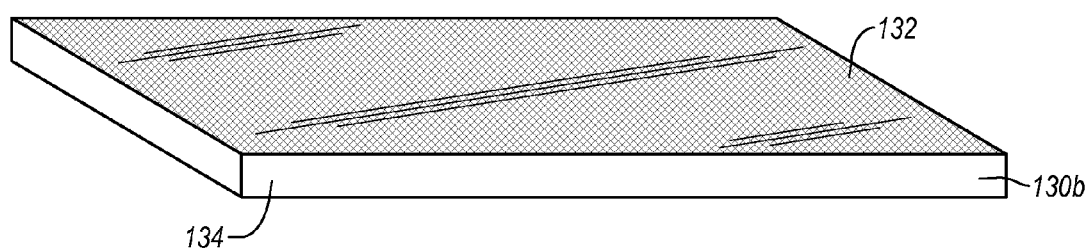

Alternatively, implementations of the present invention further include one or more apparatus and methods for applying texture to substrates using a textured roller. Specifically, a manufacturer can roll a textured roller across one or more surfaces of the heated substrate 130 to impart a highly uniform texture to the substrate 130. No matter how applied, a manufacturer can pre-form a substrate 130 by imparting a texture therein to form a pre-formed substrate 130b, such as that shown in FIG. 6B. Additionally, the performing process can involve imparting a color into the heated substrate 130 using dye sublimation, or by laminating one or more colored film layers or fabrics thereto.

Figure 7A:
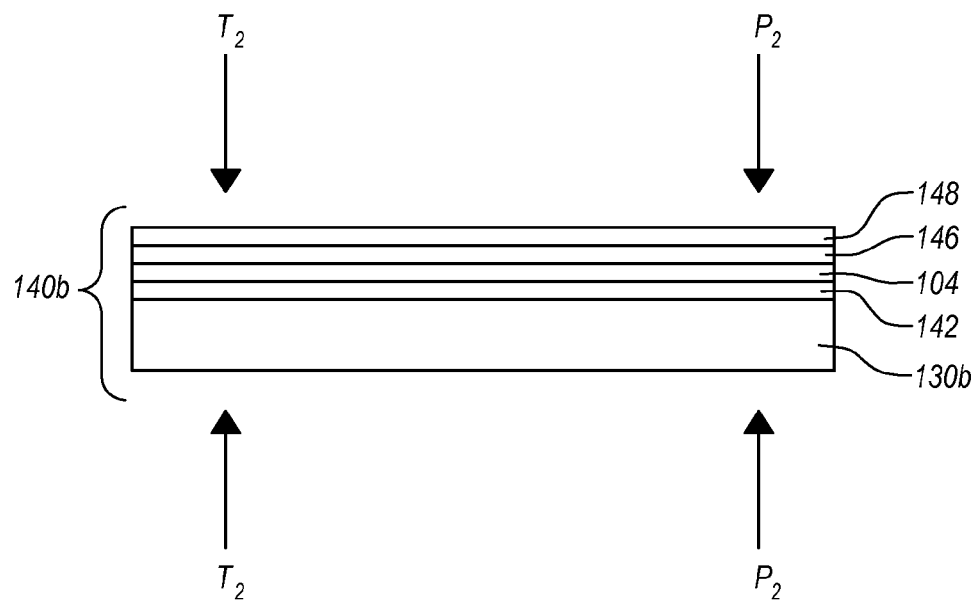
FIG. 7A illustrates a side view of yet another laminate assembly that a manufacturer may use in forming a durable, architectural panel with organic photovoltaic interlayers in accordance with an implementation of the present invention.

Similar to the pre-formed substrate 130a, a manufacturer can use the pre-formed substrate 130b to create a laminate assembly, and eventually a panel with OPV interlayers 102. For example, FIG. 7A shows that a manufacture can produce a laminate assembly 140b, which can include one or more thermoplastic tie layers 142, 146 on top of, or otherwise against, the pre-formed substrate 130b. The laminate assembly 140b can also include one or more organic photovoltaic components or interlayers 104, such as organic photovoltaic component 104 described hereinabove in relation to FIG. 2.

As illustrated by FIG. 7A, the manufacturer can then place one or more organic photovoltaic components 104 on top of, or otherwise against, the first thermoplastic tie layer 142. Next the manufacturer can place a second thermoplastic tie layer 146 on top of, or otherwise against, the organic photovoltaic component 104. One advantage provided by thermoplastic tie layers, such as those aforementioned, is that bonding can be effectuated more easily in some cases between the organic photovoltaic component 104 and adjacent layers at lower temperatures and pressures than typically used without thermoplastic tie layers. In any event, the laminate assembly 140b can also include a barrier layer 148 positioned against the second thermoplastic tie layer 146.

Upon preparing the laminate assembly 140b, FIG. 7A further shows that the manufacturer can subject the laminate assembly 140b to one or more second temperatures $T_2$ and second pressures P$_2$. As mentioned previously, the manufacturer can configure the second temperatures T$_2$ and second pressures P$_2$ to soften and activate the thermoplastic tie layers 142, 146 in order to achieve both mechanical and chemical bonding between layers of the laminate assembly 140b.

In at least one implementation, second temperatures T$_2$ and second pressures P$_2$ comprises temperatures up to about 250° F. and pressures between about 0.5 atm (or about 7-8 psi) to about 10 atm (or about 145-150 psi). Furthermore, the manufacturer can apply such temperatures and pressures in any number of apparatus, such as in a pressurized oven, lamination press, or autoclave. In an autoclave, a manufacturer may further perform the lamination by inserting the materials of the above-described laminate assembly into a vacuum bag prior to autoclaving.

Figure 7B:
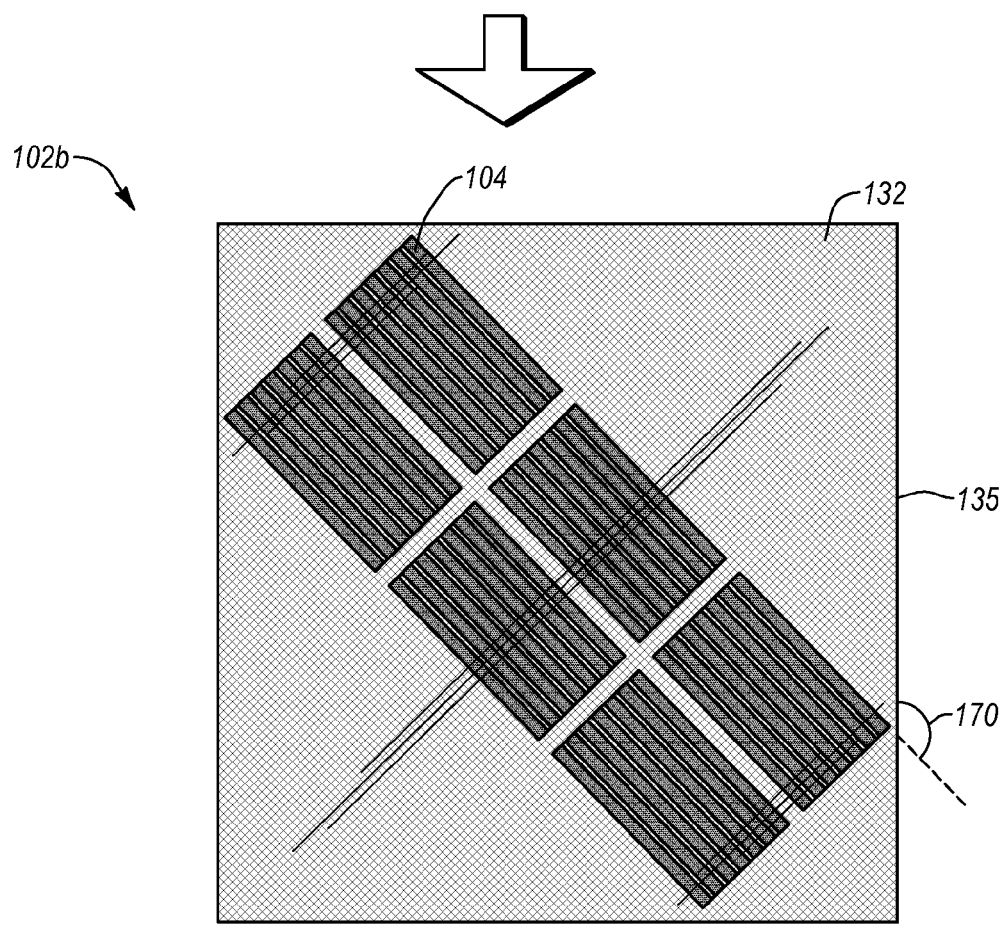
FIG. 7B illustrates a top view of a durable, architectural panel with organic photovoltaic interlayers made from the laminate assembly of FIG. 7A.

No matter how applied, the second temperatures T$_2$ and second pressures P$_2$ can cause the layers of the laminate assembly 140b to fuse together and form a laminate panel with OPV interlayers. For example, FIG. 7B illustrates an example of a panel with OPV interlayers 102b produced using the methods described above in relation to FIG. 7A. The panel with OPV interlayers 102b can further include one or more OPV components 104 fused to an upper, textured surface 132 of the pre-formed substrate 130b. Additionally, the panel with OPV interlayers 102a can include an at least partially translucent barrier layer 148 fused to one or more of the upper surface 132 of the pre-formed substrate 130b and the one or more OPV components 104.

One will appreciate in light of the disclosure herein that the panel with OPV interlayers 102b can include desirable mechanical and aesthetic properties. For example, the panel with OPV interlayers 102b can preserve the OPV components 104 from degradation or loss of performance. Furthermore, the panel with OPV interlayers 102a can have a lamination strength of at least about 2 ft.-lbs of force. Additionally, the panel with OPV interlayers 102b can have an aesthetically pleasing shape (i.e., non-planar).

Furthermore, the non-smooth, textured or embossed surfaces can provide some decorative aspects to the bottom surface of an OPV panel (where someone would stand beneath in the case of a roof shelter or canopy). The textured or embossed surfaces can also provide a further benefit in making the bottom surface be more resilient in its display of mars or scratches that may occur during transport, during installation, or in service of an OPV panel construct or panel with OPV interlayers 102b. Furthermore, such textures or embossing can provide the panel with OPV interlayers 102b with increased durability and reduced reflectivity of light. Such reflectivity can improve efficiency on the energy generation characteristics of the OPV components within the panel with OPV interlayers 102b.

FIG. 7B further illustrates that the OPV components 104 can have various orientations relative to the sides or edges of the laminate panel 102b(i.e., laminate of substrate 130 and OPV components 104). For example, FIG. 7B illustrates that a manufacturer can orient the OPV components 104 at an angle 170 relative to a side 135 of the panel with OPV interlayers 102b. In other words, OPV components 104 are diagonal, and thus aligned essentially transverse to the length or width dimension of the substrate 130(b).

One will appreciate, however, that this is merely illustrative of one possible OPV component 104 orientation. For example, the manufacturer may alternatively use photovoltaic cells that are aligned parallel (e.g., FIGS. 1 and 4B), perpendicular, or even randomly aligned between the substrates. Along these lines, the manufacturer may choose any particular such alignment for any number of reasons, including those related both to aesthetic considerations (since the substrates and even the OPV components are or can be translucent), as well as to maximize a particular photon exposure and hence electrical power output.

The following examples describe trial data used to create laminate panels with OPV interlayers using pre-formed substrates in accordance with various implementations of the present invention. These examples are intended to be purely exemplary, and should not be viewed as limiting the scope of the invention.

Example 1

A laminate panel including OPV interlayers in accordance with implementations of the present invention was prepared using the following materials:
1) ½" 3FORM ECOGLASS PC (a polycarbonate sheet)
2) 0.025" aliphatic TPU (Deerfield Urethanes A 4700)
3) POWER PLASTIC Organic PV modules (Konarka Technologies)
4) 0.010" KORAD Film (from Spartech Plastics)

The above materials were assembled into a laminate assembly including the following layers in a top to bottom order:
1) 0.010" KORAD Film;
2) 0.025" TPU
3) POWER PLASTIC OPV module
4) 0.025" TPU
5) ½" 3FORM ECOGLASS PC The above laminate assembly was laminated in a mechanical press with heated platens. A thermocouple was placed in between the top layer of TPU and the Konarka POWER PLASTIC to measure the sheet temperature. As soon as the temperature reached 230° F. the sample was transferred to a cold press and allowed to cool to 75° F.

The bond between all materials was excellent. It was not possible to separate the OPV component away from the substrate and top KORAD skin without unrealistic methods or forces. It was concluded that off-edge lamination of OPV components is recommended to help ensure a strong lamination bond.

Example 2

A laminate panel including OPV interlayers in accordance with implementations of the present invention was prepared using the following materials:
1) 24"×48"×½" Curved/pre-formed 3FORM ECOGLASS PC (a polycarbonate sheet) panel
2) 0.025" aliphatic TPU (Deerfield Urethanes A 4700)
3) 12"×48" POWER PLASTIC Organic PV modules (Konarka Technologies)
4) 0.010" KORAD Film (from Spartech Plastics)

The above materials were assembled into a laminate assembly including the following layers in a top to bottom order:
1) 0.010" KORAD Film;
2) 0.025" TPU
3) 12"×48" POWER PLASTIC OPV module
4) 0.025" TPU
5) 24"×48"×½" curved/pre-formed 3FORM ECOGLASS PC The above laminate assembly was sealed in a vacuum bag and processed in an autoclave. The vacuum of the bag was held at −25 inches-Hg. The ensuing autoclave cycle utilized a pressure of 75 psi. During the autoclave lamination cycle, the sheet temperature was allowed to reach 230° F. and held at that temperature for 1 hour. At the end of the hour, the sheet was allowed to cool to 75° F.

The bond between all materials was excellent. It was not possible to separate the OPV component away from the substrate and top KORAD skin without unrealistic methods or forces. It was concluded that off-edge lamination of OPV components to a curved surface is realizable and results in a strong lamination bond suitable for use as a structured photovoltaic panel assembly.

Example 3

A laminate panel including OPV interlayers in accordance with implementations of the present invention was prepared using the following materials:
1) 24"×96"×½" Curved/pre-formed 3FORM ECOGLASS PC (a polycarbonate sheet) panel
2) 0.025" aliphatic TPU (Deerfield Urethanes A 4700)
3) 12"×96" POWER PLASTIC Organic PV modules (Konarka Technologies)
4) 0.010" KORAD Film (from Spartech Plastics)

The above materials were assembled into a laminate assembly including the following layers in a top to bottom order:
1) 0.010" KORAD Film;
2) 0.025" TPU
3) 12"×96" POWER PLASTIC OPV module
4) 0.025" TPU
5) 24"×96"×½" curved/pre-formed 3FORM ECOGLASS PC Hash marks were made on the OPV components and TPU to determine the amount of movement that will occur during the lamination process. The above layup was sealed in a vacuum bag and placed in an autoclave for lamination. The vacuum bag was held at −25 inches-Hg. The ensuing autoclave cycle utilized a pressure of 75 psi. During the lamination cycle, the sheet temperature was allowed to reach 230° F. and was held at that temperature for 1 hour. At the end of the hour, the sheet was allowed to cool to 75° F.

The bond between all materials was excellent. It was not possible to separate the OPV component away from the TPU laminated substrate or from the KORAD skin without unrealistic methods or forces. Also, there was no significant movement of the OPV component during the lamination process. Additionally, OPV performance was verified with no loss of power/efficiency. It was concluded that off-edge lamination of OPV modules remains strong when done on a larger scale. Also, the amount of OPV movement is minimal and will not affect the aesthetic and operation of the modules.

Example 4

A laminate panel including OPV interlayers in accordance with implementations of the present invention was prepared using the following materials:
1) 48"×96"×½" Curved/pre-formed 3FORM ECOGLASS PC (a polycarbonate sheet) panel
2) 0.025" aliphatic TPU (Deerfield Urethanes A 4700)
3) 24"×96" POWER PLASTIC Organic PV modules (Konarka Technologies)
4) 0.010" KORAD Film (from Spartech Plastics)

The above materials were assembled into a laminate assembly including the following layers in a top to bottom order:
1) 0.010" KORAD Film;
2) 0.025" TPU
3) 24"×96" POWER PLASTIC OPV module
4) 0.025" TPU
5) 48"×96"×½" curved/pre-formed 3FORM ECOGLASS PC Hash marks were made on the OPV components and TPU to determine the amount of movement that will occur during the lamination process. The above laminate assembly was sealed in a vacuum bag and placed in an autoclave for lamination. The vacuum bag was held at −25 inches-Hg. For the ensuing autoclave cycle utilized a pressure of 75 psi. During the autoclave cycle, the sheet temperature was allowed to reach 230° F. and held at that temperature for 1 hour. At the end of the hour, the sheet was allowed to cool to 75° F.

The bond between all materials was excellent. It was not possible to pull the OPV component away from the TPU substrate. Also, there was no visible movement of the OPV component during the lamination process. Additionally, OPV performance was verified with no loss of power/efficiency. It was concluded that off-edge lamination of OPV modules remains strong when done on a larger scale. Also, there was no visible movement between the OPV components and the TPU.

Figure 8:
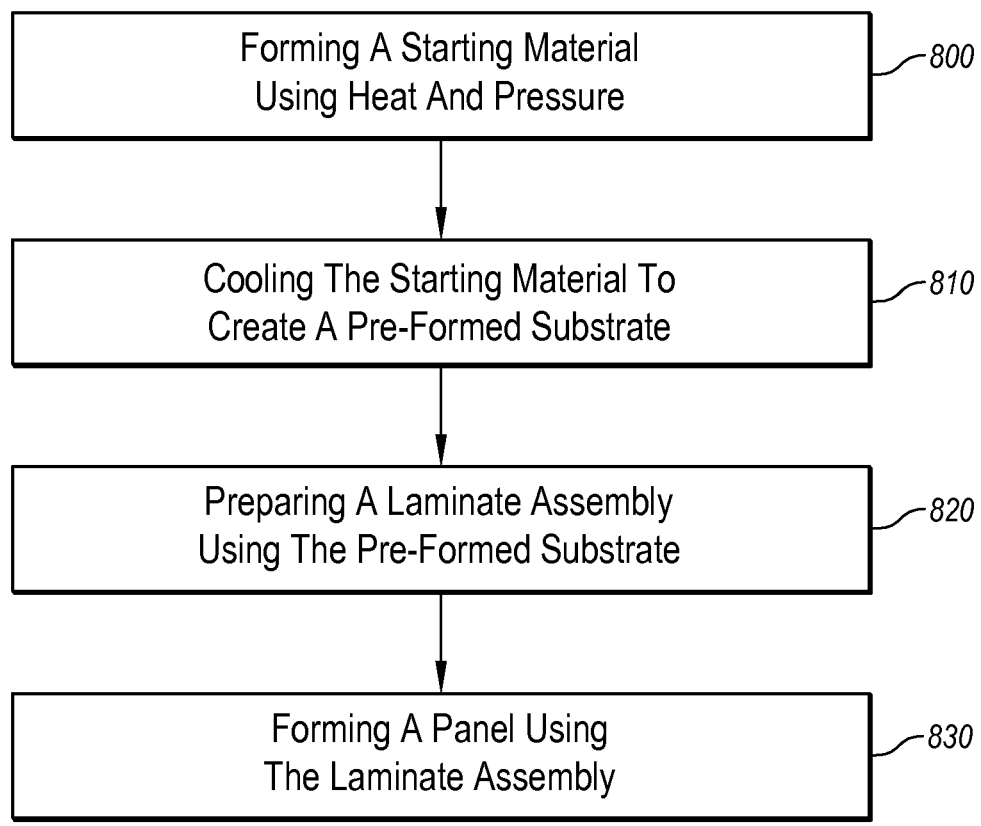
FIG. 8 illustrates a chart of acts and steps in a method of forming a durable, architectural panel with organic photovoltaic interlayers using a pre-formed substrate in accordance with an implementation of the present invention.

Accordingly, FIGS. 1-7B, the corresponding text, and the examples, provide a number of different components and mechanisms for creating panels with OPV interlayers using pre-formed substrates in an efficient, aesthetically pleasing way. In addition to the foregoing, implementations of the present invention can also be described in terms of flowcharts comprising acts and steps in a method for accomplishing a particular result. For example, FIG. 8 illustrates a flowchart of one exemplary method for producing an architectural panel with OPV interlayers 102 with the principles of the present invention. The acts of FIG. 8 are described below with reference to the components and diagrams of FIGS. 1 through 7B.

For example, FIG. 8 shows that the method of creating an architectural panel with OPV interlayers 102 can include an act 800 of forming a pre-formed substrate 130a, b. Act 800 can include applying a first temperature and a first pressure to a starting material, such as substrate 130, to allow for softening and forming of the starting material 130. For example, a manufacturer can subject a substrate 130 to a first temperature from about 200° F. to about 500° F., and a first pressure of about 0.5 psi to about 200 psi using an autoclave, lamination press, vacuum bag, a pressurized oven, etc.

Additionally, act 800 can shaping the starting material 130 into a non-planar configuration, imparting color to the heated substrate, embedding a texture into one or more surfaces of the heated substrate, or a combination thereof. For instance, act 800 can involve pressing a heated substrate 130 against a mold to impart a non-planar shape to the substrate 130. Additionally or alternatively, act 800 can involve pressing a textured object 160, 162 against one or more surfaces of a heated substrate 130 to embed a texture therein. Still further, act 800 can additionally or alternatively involve imparting color to the panel by sublimating a dye therein or fusing one or more colored films thereto.

In addition, FIG. 8 shows that method can comprise an act 810 of cooling the pre-formed substrate. Act 810 can involve cooling the pre-formed substrate 130a, 130b below the glass transition of the starting material of the pre-formed substrate 130a, 130b. For example, a manufacturer can place the pre-formed substrate 130a, 130b into a cold press or simply position can position the pre-formed substrate 130a, 130b so that ambient air can cool the pre-formed substrate 130a, 130b.

FIG. 8 also shows that the method can comprise an act 820 of preparing a laminate assembly 140, 140a using the pre-formed substrate 130a, 130b. Act 820 can include preparing a laminate assembly comprising the pre-formed substrate 130a, 130b, one or more OPV components 104, and an at least partially translucent barrier layer 148. For example, the manufacturer can place one or more OPV components 104 between a pre-formed substrate 130a, 130b and an at least partially translucent barrier 148, 130a, 130b in a stack formation. Additionally, act 820 can include positioning the one or more OPV components 104 about a surface of the pre-formed substrate a first distance 150 from any edge of the surface of the pre-formed substrate 130a, 130b. Act 820 can further include positioning the at least partially translucent barrier layer 148 over the one or more OPV components 104 and about the surface of the pre-formed substrate 130a, 130b a second distance 152 from any edge of the surface of the pre-formed substrate 130a, 130b, wherein the second distance 152 is less than the first distance 150.

FIG. 8 further shows that the method can comprise an act 830 of forming a panel using the pre-formed substrate. In particular, act 830 can include subjecting the laminate assembly 140, 140a to a second temperature and a second pressure configured to fuse the laminate assembly together. For example, act 830 can include activating one or more thermoplastic tie layers 142, 146 to fuse the one or more OPV components 104 to the pre-formed substrate 130a, 130b and the at least partially translucent barrier 148. Furthermore, act 830 can include the use of temperatures and pressures sufficiently low to prevent degrading of the one or more OPV components 104.

For instance, act 830 can involve subjecting the laminate assembly 140, 140a to temperatures up to about 250° F. and pressures between about 0.5 atm (or about 7-8 psi) to about 10 atm (or about 145-150 psi). Additionally, a manufacturer may apply such temperatures and pressures in any number of apparatus, such as in a pressurized oven, lamination press, or autoclave. In an autoclave, a manufacturer may further perform the lamination by inserting the materials of the above-described laminate assembly into a vacuum bag.

Although not shown, a manufacturer can also perform an act of coating (e.g., with 3FORM PATINA 2K specialty coating) any or all surfaces of the panel 102 (e.g., a laminate of substrate(s) 130 and OPV component(s) 140 after laminating and thermoforming processes when the panel is in final product form). In one implementation, the spray coating comprises an aliphatic acrylic urethane coating containing silica powder, which provides the panel with added protection against physical, light-based, and chemical damage. Spray-coating also allows the panel surface to be more easily re-finished in the event of any marring/damage.

Accordingly, the schematics and methods described herein provide a number of unique products, as well as ways for creating aesthetically pleasing, structural or architecturally-functional panels with integrated OPV interlayers. As discussed herein, these panels can be substantially translucent or transparent in order to provide a desired aesthetic. Furthermore, the implementations of the present invention provide methods of creating architecturally-suitable panels with OPV interlayers without damaging for degrading the OPV components during processing. Accordingly, implementations of the present invention can create not only a translucent photovoltaic panel with electricity generating capabilities, but also a panel that is sufficiently strong to avoid delamination even under extreme conditions, such as dynamic and static loads, wide fluctuations in temperature, peeling forces or forceful impacts. In one implementation, for example, the photovoltaic, non-planar panels of the present invention are capable of resisting peel delamination forces of up to 2 ft-lbs or more.

In view of such properties, one will appreciate that the non-planar (potentially even asymmetrical) photovoltaic panels made in accordance with the present invention can function in a wide range of applications. For example, as mentioned previously, FIG. 1 illustrates a schematic of a panel (e.g., panel with OPV interlayers 102) including translucent, OPV components 104 as a decorative roof structure, such as when used for a mass-transit shelter or canopy. The panels with OPV interlayers 102 of the present invention, however, are not necessarily limited to horizontal orientations. Such panels may be assembled in sloped or even vertical orientations such as to maximize design, structure, performance or functionality of the integrated OPV installation or application.

The present invention may be embodied in other specific forms without departing from its spirit or essential characteristics. The described embodiments are to be considered in all respects only as illustrative and not restrictive. For example, the substrates and panel described and depicted herein are each rectangular in shape. In additional or alternative implementations, the substrates and panel can have circular, triangular, or other simple or complex geometric shapes. The scope of the invention is, therefore, indicated by the appended claims rather than by the foregoing description. All changes that come within the meaning and range of equivalency of the claims are to be embraced within their scope.

We claim:

1. A method of manufacturing an organic photovoltaic panel that has a lamination strength of at least about 2 ft.-lbs of force, comprising:

forming a pre-formed substrate, the pre-formed substrate comprising a translucent sheet having a width of about 4 feet or more, a length of about 8 feet or more, and a thickness between about 1/32 inches and about 5 inches, and embedding a texture into at least one surface of the pre-formed substrate;

preparing a translucent barrier layer that has a length and a width that is smaller than that of the pre-formed substrate;

encapsulating an organic photovoltaic component layer in a clear plastic film, the organic photovoltaic component layer having one or more organic photovoltaic inks printed thereon;

preparing a laminate assembly by aligning the encapsulated, organic photovoltaic component layer between the pre-formed substrate and the translucent barrier layer, and directly against one or more tie layers, so that a plurality of edges of the organic photovoltaic component layer and the translucent barrier layer are off edge relative to the pre-formed substrate, the translucent barrier layer providing an outer surface of the laminate assembly; and subjecting the laminate assembly to a fusing temperature of up to 250° F. to thereby fuse the laminate assembly without degrading the organic photovoltaic component layer;

wherein the embedded texture reduces reflectivity of light to thereby enhance the amount of light that is received by the organic photovoltaic component layer and to thereby enhance efficiency of the fused organic photovoltaic panel.

2. The method as recited in claim 1, wherein the translucent sheet has a melting temperature that is higher than the temperature used to fuse the laminate assembly.

3. The method as recited in claim 2, wherein subjecting the laminate assembly to the fusing temperature further comprises applying a pressure of between about 0.5 atm and about 10 atm.

4. The method as recited in claim 1, wherein forming the pre-formed substrate further comprises imparting a color to the translucent sheet.

5. The method as recited in claim 1, wherein preparing the laminate assembly further comprises positioning as least a second tie layer in the laminated assembly between the organic photovoltaic component layer and one of the pre-formed substrate or the translucent barrier layer.

6. The method as recited in claim 1, further comprising subjecting the laminate assembly to the fusing temperature within an autoclave.

7. The method as recited in claim 1, further comprising subjecting the laminate assembly to the fusing temperature within a lamination press.

8. The method as recited in claim 1, further comprising:
shaping the pre-formed substrate and the barrier layer into corresponding non-planar configurations that enable the pre-formed substrate and the barrier layer to overlap and fit together.

9. The method as recited in claim 1, wherein the step of aligning the encapsulated, organic photovoltaic component layer and the translucent barrier layer to be off edge relative to the pre-formed substrate further comprises:
positioning the organic photovoltaic component layer about a surface of the pre-formed substrate a first distance from any edge of the surface of the pre-formed substrate; and
positioning the translucent barrier layer over the organic photovoltaic component layer and about the surface of the pre-formed substrate a second distance from any edge of the surface of the pre-formed substrate, wherein the second distance is less than the first distance.

10. The method as recited in claim 1, further comprising treating the resultant organic photovoltaic panel for outdoor use by spraying an aliphatic acrylic urethane coating containing silica powder about the resultant organic photovoltaic panel.

11. The method as recited in claim 1, wherein the organic photovoltaic component layer is both bendable and transparent, such that the organic photovoltaic component layer can conform to a non-planar shape of the pre-formed substrate without breaking, and such that photons are both captured by and pass through the organic photovoltaic component layer.

12. A method of manufacturing an organic photovoltaic panel that has a lamination strength of at least about 2 ft.-lbs of force, comprising:
forming a pre-formed substrate, the pre-formed substrate comprising a translucent sheet having a width of about 4 feet or more, a length of about 8 feet or more, and a thickness between about 1/32 inches and about 5 inches, the step of forming the pre-formed substrate further comprising molding the translucent sheet into a non-planar shape, and imparting a color into at least one surface of the pre-formed substrate;
providing an organic photovoltaic layer that is bendable, the organic photovoltaic layer comprising a film having one or more organic photovoltaic inks printed thereon, the film and organic photovoltaic inks being encapsulated by a clear thermoplastic film;
aligning a laminate assembly comprising the organic photovoltaic layer, one or more tie layers, and a translucent barrier layer over the pre-formed substrate, wherein the translucent barrier layer covers the organic photovoltaic layer and one or more tie layers, and the translucent barrier layer, one or more tie layers, and organic photovoltaic layer all conform to the non-planar shape of the pre-formed substrate; and
fusing the laminate assembly without degrading the organic photovoltaic layer.

13. The method as recited in claim 12, wherein the translucent sheet has a melting temperature that is higher than the temperature used to fuse the laminate assembly.

14. The method as recited in claim 13, wherein fusing the laminate further comprises applying a pressure of between about 0.5 atm and about 10 atm.

15. The method as recited in claim 12, wherein forming the pre-formed substrate further comprises pressing a textured object into the translucent sheet to embed a texture therein.

16. The method as recited in claim 12, wherein aligning the laminate assembly further comprises aligning at least one tie layer on opposing sides of the organic photovoltaic layer.

17. The method as recited in claim 12, further comprising fusing the laminate assembly within an autoclave.

18. The method as recited in claim 12, further comprising fusing the laminate assembly within a lamination press.

19. The method as recited in claim 12, further comprising imparting a color to the translucent barrier layer.

20. The method as recited in claim 12, wherein:
the translucent barrier layer has a surface area that is less than a surface area of the pre-formed substrate; and
the organic photovoltaic layer has a surface area that is less than a surface area of the translucent barrier layer.

21. The method as recited in claim 20, wherein aligning the laminate assembly further comprises positioning the translucent barrier layer and the organic photovoltaic layer about a surface of the pre-formed substrate such that a plurality of sides of the translucent barrier layer and the organic photovoltaic layer are off edge relative to the pre-formed substrate.

22. The method as recited in claim 12, further comprising:
positioning a first of the one or more tie layers on one side of the organic photovoltaic component layer; and
positioning a second of the one or more tie layers on an opposing side of the organic photovoltaic layer;
wherein the first tie layer is in direct contact with the pre-formed substrate, and the second tie layer is in direct contact with the translucent barrier layer.

23. The method as recited in claim 22, wherein the step of fusing the laminate assembly further comprises melting the first and second tie layers without melting the pre-formed substrate or the translucent barrier layer.

24. The method as recited in claim 12, further comprising treating the resultant organic photovoltaic panel for outdoor use by spraying an aliphatic acrylic urethane coating containing silica powder about the resultant organic photovoltaic panel.

25. The method as recited in claim 12, wherein the bendable, organic photovoltaic layer is transparent, such that photons are both captured by and pass through the organic photovoltaic layer.

26. A method of manufacturing an organic photovoltaic panel that has a lamination strength of at least about 2 ft.-lbs of force, comprising:
forming a pre-formed substrate, the pre-formed substrate comprising a translucent sheet having a width of about 4 feet or more, a length of about 8 feet or more, and a thickness between about 1/32 inches and about 5 inches, the step of forming the pre-formed substrate further comprising molding the translucent sheet into a non-planar shape;

imparting a color into at least one surface of the pre-formed substrate, and a color into at least one surface of a translucent barrier layer to create a colored barrier layer;

providing an organic photovoltaic layer that is both bendable and transparent, the organic photovoltaic layer comprising a translucent film having one or more organic photovoltaic inks printed thereon, the translucent film and organic photovoltaic inks being encapsulated by a clear thermoplastic film;

aligning a laminate assembly comprising the organic photovoltaic layer, first and second tie layers, and the colored barrier layer over the pre-formed substrate, wherein the colored barrier layer covers the first tie layer, the organic photovoltaic layer, and the second tie layer; and the colored barrier layer, the first and second tie layers, and organic photovoltaic layer all conform to the non-planar shape of the pre-formed substrate; and fusing the laminate assembly without degrading the organic photovoltaic layer by subjecting the laminate assembly to a temperature and pressure sufficient to melt the first and second tie layers without melting the pre-formed substrate, the organic photovoltaic layer, or the colored barrier layer.

27. The method as recited in claim 26, wherein the translucent sheet has a melting temperature that is higher than the temperature used to fuse the laminate assembly.

28. The method as recited in claim 27, wherein subjecting the laminate assembly to the fusing temperature further comprises applying a pressure of between about 0.5 atm and about 10 atm.

29. The method as recited in claim 26, further comprising subjecting the laminate assembly to the fusing temperature within an autoclave.

30. The method as recited in claim 26, further comprising subjecting the laminate assembly to the fusing temperature within a lamination press.

31. The method as recited in claim 26, further comprising:
shaping the pre-formed substrate and the barrier layer into corresponding non-planar configurations that enable the pre-formed substrate and the translucent barrier layer to overlap and fit together.

32. The method as recited in claim 26, further comprising positioning the organic photovoltaic layer about a surface of the pre-formed substrate a first distance from any edge of the surface of the pre-formed substrate, such that the organic photovoltaic layer is positioned off edge relative to the pre-formed substrate.

33. The method as recited in claim 32, further comprising positioning the translucent barrier layer over the organic photovoltaic layer and about the surface of the pre-formed substrate a second distance from any edge of the surface of the pre-formed substrate, wherein the second distance is less than the first distance.

34. The method as recited in claim 26, wherein the organic photovoltaic layer can conform to a non-planar shape of the pre-formed substrate without breaking, and photons are both captured by and pass through the organic photovoltaic layer.

* * * * *

UNITED STATES PATENT AND TRADEMARK OFFICE
CERTIFICATE OF CORRECTION

| | | |
|---|---|---|
| PATENT NO. | : 9,076,731 B2 | Page 1 of 2 |
| APPLICATION NO. | : 13/615146 | |
| DATED | : July 7, 2015 | |
| INVENTOR(S) | : Willham et al. | |

It is certified that error appears in the above-identified patent and that said Letters Patent is hereby corrected as shown below:

Column 1
Lines 64 and 65, change "photovoltaic" to --photovoltaic modules--

Column 2
Line 39, change "module" to --modules--

Column 5
Line 48, change "manufacturer" to --a manufacturer--

Column 8
Line 30, change "350°" to --350° F--

Column 11
Line 19, change "fl.-lbs" to --ft.-lbs--

Column 12
Line 9, change "FIG. 3A" to --FIG. 6A--
Line 45, change "manufacture" to --manufacturer--

Column 13
Line 35, change "fl.-lbs" to --ft.-lbs--

Column 14
Line 18 and 51, change "Deerfield Urethanes A 4700" to --Deerfield Urethane A4700--

Column 15
Line 19 and 59, change "Deerfield Urethanes A 4700" to --Deerfield Urethane A4700--

Signed and Sealed this
Twenty-first Day of June, 2016

Michelle K. Lee
*Director of the United States Patent and Trademark Office*

CERTIFICATE OF CORRECTION (continued)
U.S. Pat. No. 9,076,731 B2

Column 16
Line 63, change "simply position can position" to --can position--

Column 17
Line 58, change "for degrading" to --or degrading--